(12) United States Patent
Chou et al.

(10) Patent No.: US 6,791,239 B2
(45) Date of Patent: Sep. 14, 2004

(54) PIEZOELECTRIC TRANSFORMATION DRIVING APPARATUS

(75) Inventors: Chin-Wen Chou, Hsin-Tien (TW); Eddie Cheng, Hsin-Tien (TW)

(73) Assignee: Shin Jiuh Corp. (TW)

( * ) Notice: Subject to any disclaimer, the term of this patent is extended or adjusted under 35 U.S.C. 154(b) by 229 days.

(21) Appl. No.: 10/298,688

(22) Filed: Nov. 19, 2002

(65) Prior Publication Data

US 2004/0095039 A1 May 20, 2004

(51) Int. Cl.[7] .......................................... H01L 41/107
(52) U.S. Cl. .................................................. 310/318
(58) Field of Search ................................... 310/318

(56) References Cited

U.S. PATENT DOCUMENTS 6,075,325 A * 6/2000 Kouno et al. ............... 315/307
6,184,631 B1 * 2/2001 Noma et al. ................ 315/224
2001/0035698 A1 * 11/2001 Nakatsuka et al. .......... 310/318

FOREIGN PATENT DOCUMENTS

JP    2001-85759    *  3/2001    ......... H01L/41/107

* cited by examiner

Primary Examiner—Thomas M. Dougherty
(74) Attorney, Agent, or Firm—Birch, Stewart, Kolasch & Birch, LLP

(57) ABSTRACT

A piezoelectric transformation driving apparatus for driving elements or products to be driven by a high or a low voltage includes a pulse-width modulation (PWM) control unit, a plurality of driving units, a plurality of transformation units, a plurality of piezoelectric units, and a plurality of loads. The PWM control unit outputs signals of the same phase and frequency to drive synchronously the driving units, the transformation units, the piezoelectric units and the loads to operate synchronously.

8 Claims, 4 Drawing Sheets

PIEZOELECTRIC TRANSFORMATION DRIVING APPARATUS

FIELD OF THE INVENTION

The present invention relates to a piezoelectric transformation driving apparatus and particularly an apparatus that uses a single pulse-width modulation (PWM) control unit to drive synchronously a plurality of driving units, transformation units, piezoelectric units and loads.

BACKGROUND OF THE INVENTION

The light source of liquid crystal display (LCD) screens that are now being commonly used on desktop and notebook computers, PDAs, and Webpads is generated by a cold cathode fluorescent lamp (CCFL) actuated by a driving unit under a high voltage that projects light to a back panel so that displaying pictures become visible to users.

The LCD TV or LCD screen with a membrane touch screen requires a greater illumination to compensate visual requirements. The general driving device for actuating the CCFL as shown in FIG. 1 usually uses one PWM control unit to drive one driving unit, then the driving unit drives the transformer and load (CCFL). The CCFL is ignited by a high voltage. A greater current will generate a greater illumination.

When the illumination and evenness of the back light is not sufficient, a plurality of lamps are needed. To meet this requirement, the number of the PWM control unit for driving the ignition, driving unit, and transformer also increases. As a result, the size of the circuit board becomes larger, and manufacturing is more difficult and the cost increases.

SUMMARY OF THE INVENTION

Therefore the primary object of the invention is to resolve the aforesaid disadvantages. The invention employs a single PWM control unit to drive a plurality of driving units, transformation units, piezoelectric units and loads to reduce the number of elements, shrink the circuit board, and simplify the manufacturing process and reduce the cost.

In order to achieve the foregoing object, the piezoelectric transformation driving apparatus of the invention includes a PWM control unit, a plurality of driving units, transformation units, piezoelectric units and loads. The PWM control unit outputs driving signals of the same phase and same frequency to synchronously drive the driving units, transformation units, piezoelectric units and loads to operate simultaneously.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
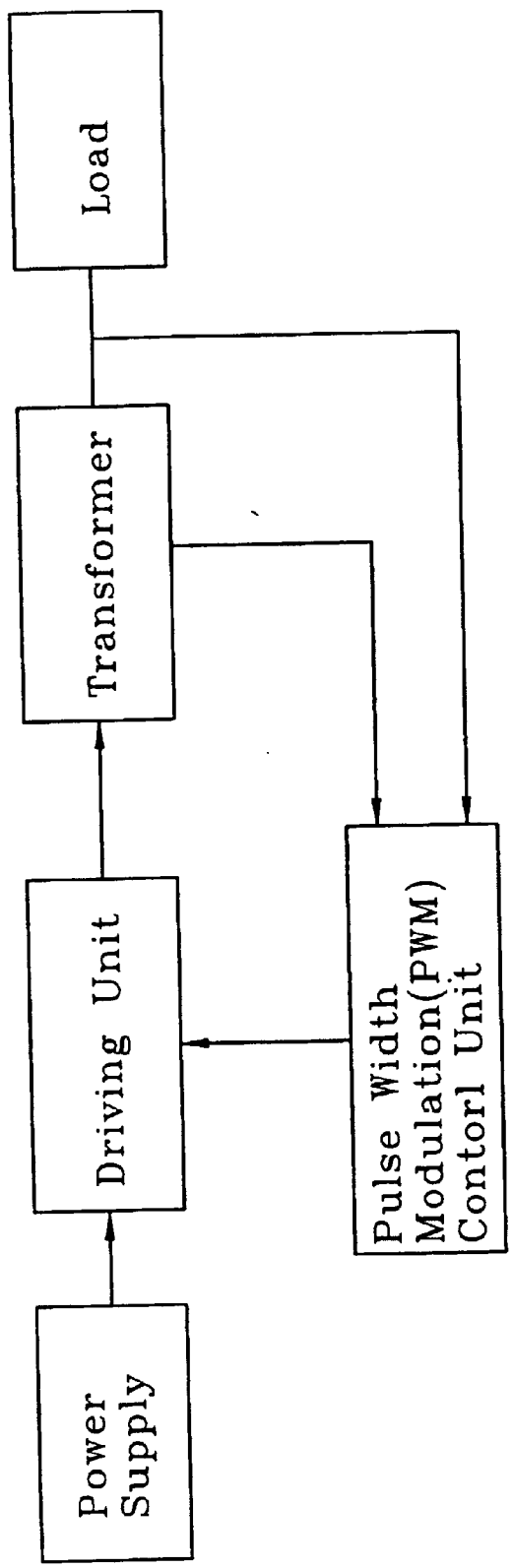
FIG. 1 is a circuit diagram of a conventional piezoelectric transformation driving apparatus.
Figure 2:
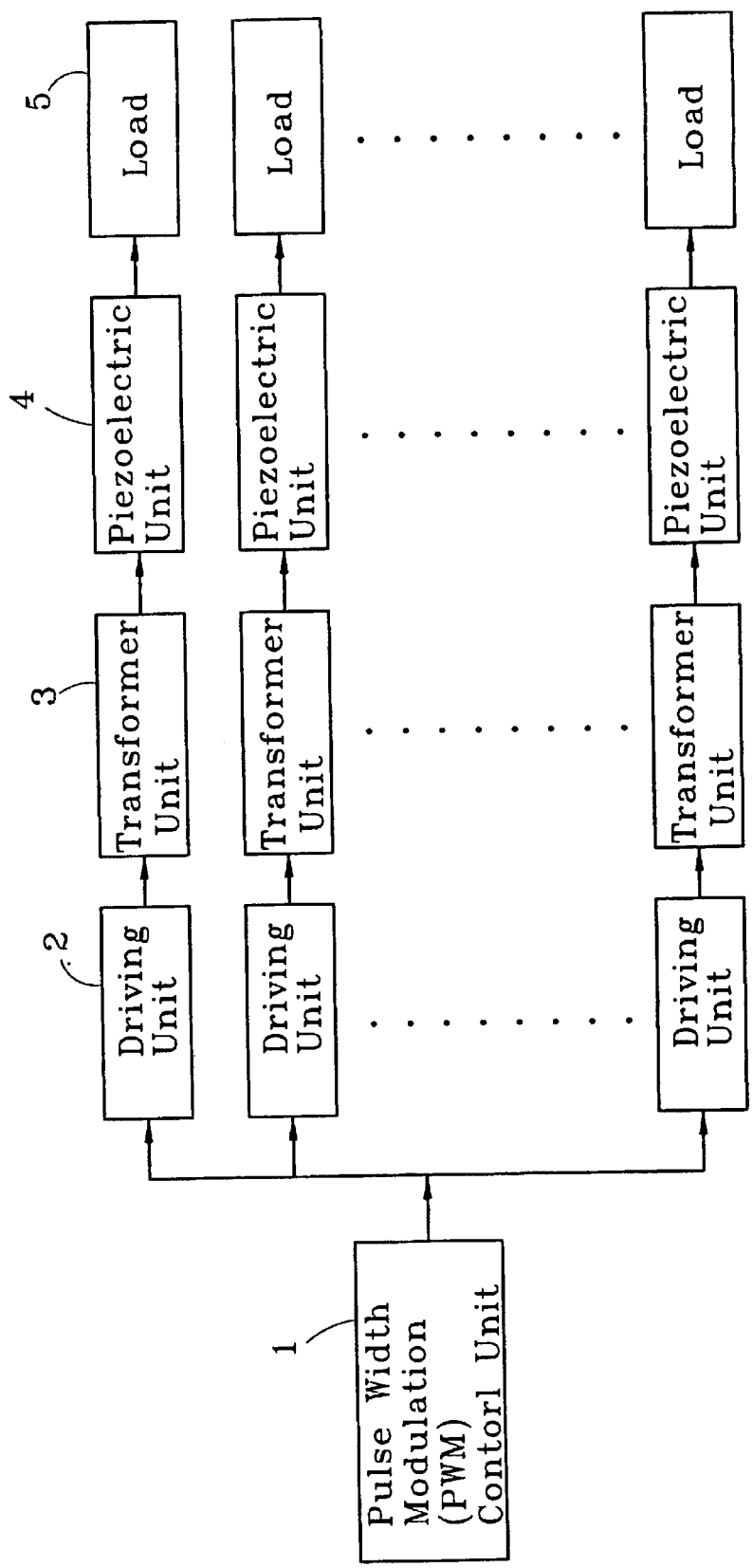
FIG. 2 is a block diagram of a first embodiment of the invention.

Refer to FIG. 2 for a first embodiment of the invention. The piezoelectric transformation driving apparatus of the invention is adopted for use on elements or products to be driven by a high voltage or a low voltage. The apparatus consists of a PWM control unit 1, a plurality of driving units 2 connecting to the PWM control unit 1 and being driven synchronously by the same, a plurality of transformation units 3 connecting to the driving units 2 and being driven synchronously by the same, a plurality of piezoelectric units 4 connecting to the transformation units 3 and being driven synchronously by the same, and a plurality of loads 5 connecting to the piezoelectric units 4 and being driven synchronously by the same. The PWM control unit 1 outputs driving signals of the same phase and same frequency to synchronously drive the driving units 2, transformation units 3, piezoelectric units 4 and loads 5 to operate simultaneously. Thus the number of elements decreases, the circuit board may be shrunk, the manufacturing process may be simplified and the cost may be reduced.

The PWM control unit 1 is activated after having received an external power supply (not shown in the drawing), and delivers an output signal of the same phase and same frequency to drive the driving units 2 synchronously.

Each of the driving units 2 consists of metal-oxide semiconductor (MOS) elements to generate a driving signal output after having received the driving signal of the same phase and same frequency output from the PWM control unit 1.

Each of the transformation units 3 includes an inductance for transforming signals output by the driving unit 2.

Each of the piezoelectric units 4 includes a single laminate or multi-laminate piezoelectric sheet or a transformer for boosting or lowering voltage output, and connects a voltage feeding back to the PWM control unit 1. Each load 5 also connects a current feeding back to the PWM control unit 1 so that the PWM control unit 1 can detect the current of the load 5 to control the average current of the load 5.

The loads 5 are elements or products to be driven by a high or a low voltage such as CCFLs, ozone generators, negative ions generators, or the like.

When the apparatus is activated, the PWM control unit 1 outputs a driving signal of the same phase and same frequency to synchronously drive the driving units 2, the driving units 2 are driven and generate driving signals which are transformed by the transformation units 3, then drive the piezoelectric units 4; then each piezoelectric unit 4 drives one load 5 to operate. Meanwhile, the load 5 connects a current feeding back to the PWM control unit 1 which detects the current of the load 5 and controls the average current of the load 5 so that the load 5 is driven evenly.

Figure 3:
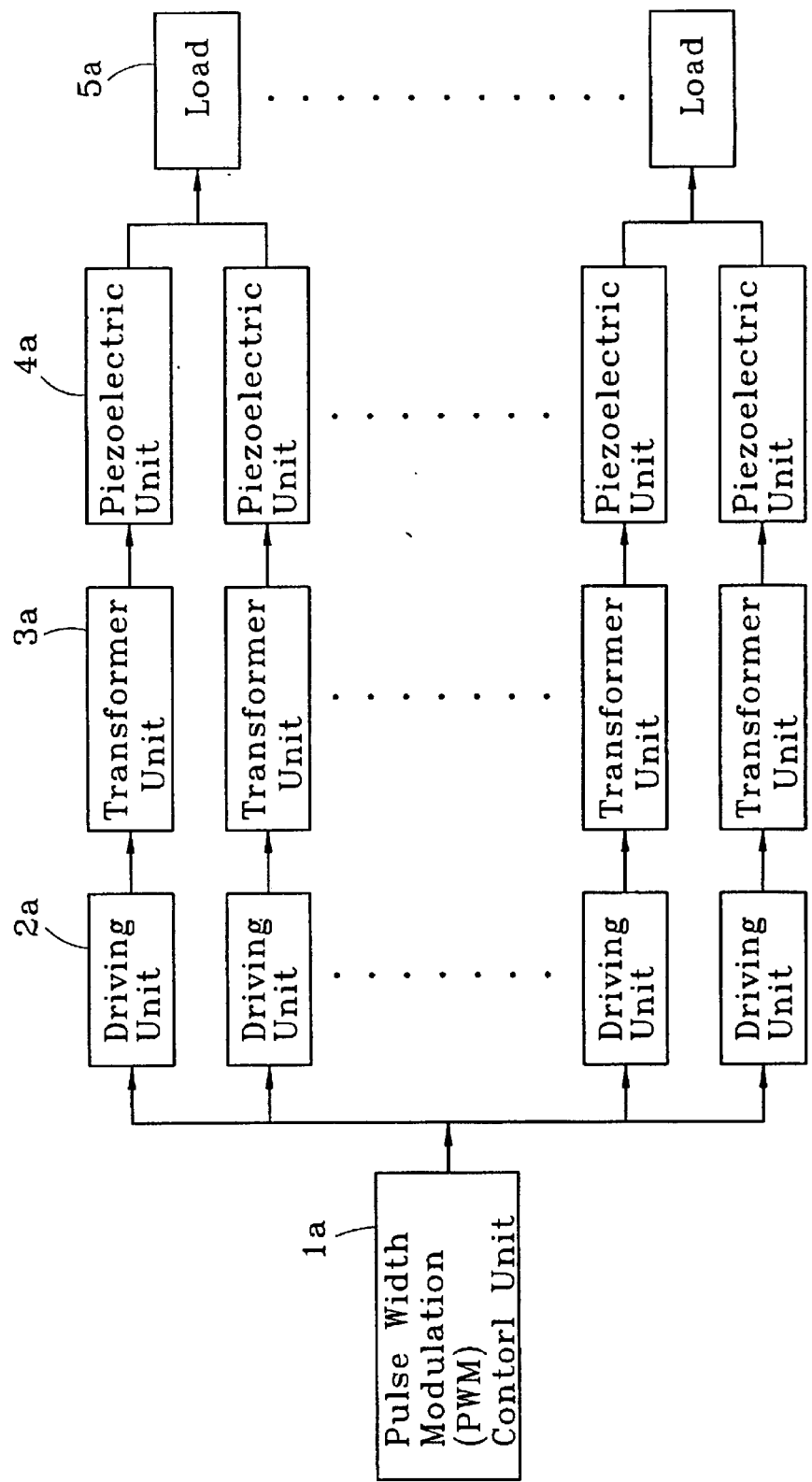
FIG. 3 is a block diagram of a second embodiment of the invention.

Refer to FIG. 3 for a second embodiment of the invention. It is substantially like the first embodiment set forth above. The differences is that after a single PWM control unit 1a drove a plurality of driving units 2, two paths of driving units 2a, transformation units 3a, and piezoelectric units 4a are coupled to drive a single loads 5a. Meanwhile, the two piezoelectric units 4a output a pair of voltages of opposite phases to the load 5a so that output current is more even and a greater power output and an improved mating impedance may be obtained. The single PWM control unit 1a can drive a plurality of loads 5a simultaneously.

Figure 4:
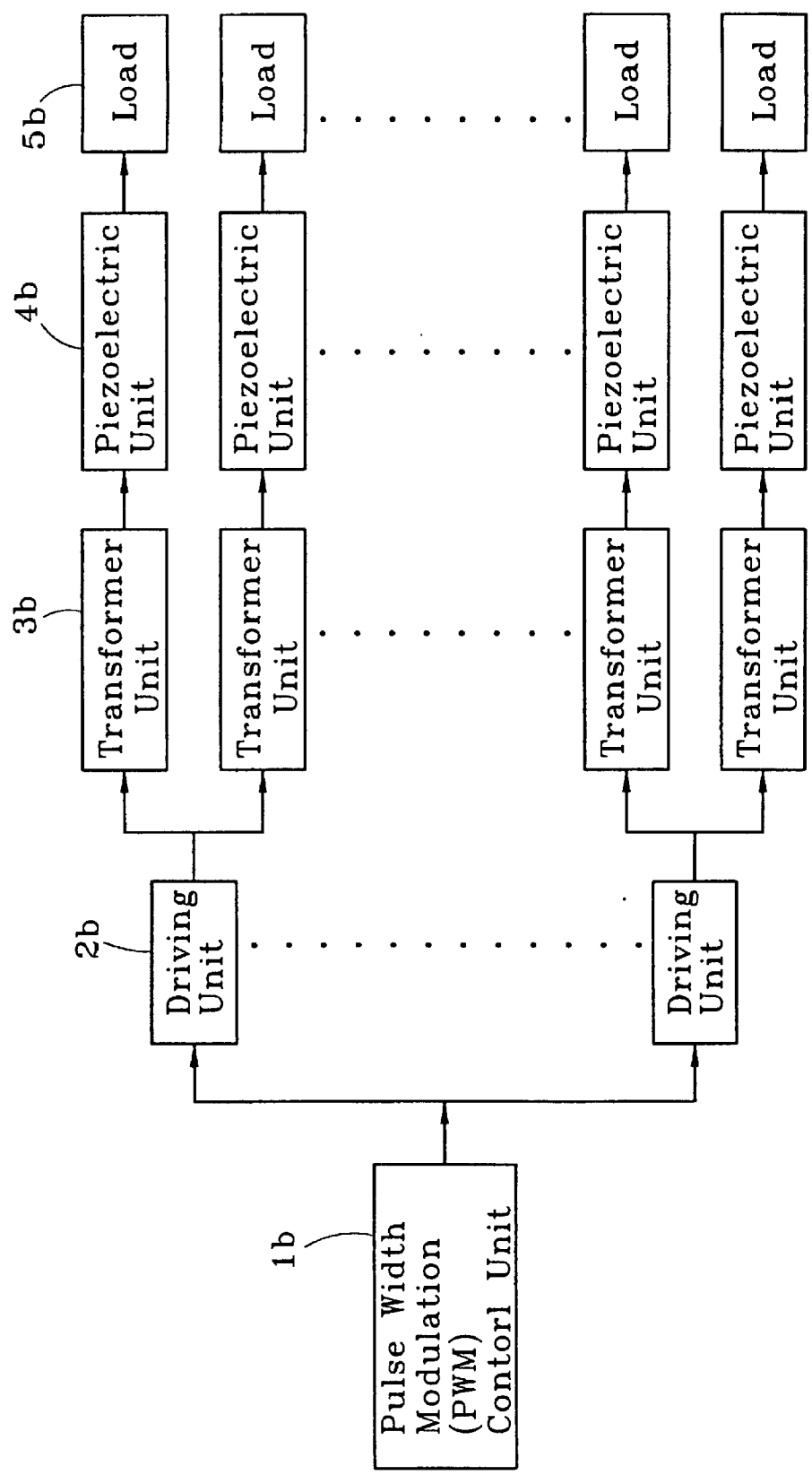
FIG. 4 is a block diagram of a third embodiment of the invention.

Refer to FIG. 4 for a third embodiment of the invention. It is substantially like the two embodiments set forth above. The differences is that after a single PWM control unit 1b drove a plurality of driving units 2, a single driving unit 2b drives two paths of transformation units 3b, piezoelectric units 4b and loads 5b. Thereby the number of elements decreases, the manufacturing process may be simplified and the cost may be reduced for the piezoelectric transformation driving apparatus.

What is claimed is:

1. A piezoelectric transformation driving apparatus for driving elements or products to be driven by a high or a low voltage, comprising:
   a pulse-width modulation (PWM) control unit for delivering output signals of a same phase and a same frequency;
   a plurality of driving units connecting to the PWM control unit and being driven synchronously by the signals of the same phase and the same frequency output by the PWM control unit;
   a plurality of transformation units connecting to the driving units and being driven by signals output by the driving units;
   a plurality of piezoelectric units connecting to the transformation units and being driven by signals output by the transformation units; and
   a plurality of loads connecting to the piezoelectric units and being driven by signals output by the piezoelectric units;
   wherein the signals of the same phase and frequency output by the PWM control unit synchronously drive the driving units, the transformation units, the piezoelectric units and the loads to operate.

2. The piezoelectric transformation driving apparatus of claim 1, wherein the piezoelectric units are selectively designed and constructed with a single layer or multiple layers.

3. The piezoelectric transformation driving apparatus of claim 1, wherein the transformation units include inductance.

4. The piezoelectric transformation driving apparatus of claim 1, wherein the driving units consist of metal-oxide semiconductor elements.

5. The piezoelectric transformation driving apparatus of claim 1, wherein the elements to be driven by a high voltage are selected from the group consisting of cold cathode fluorescent lamps, ozone generators or negative ions generators.

6. A piezoelectric transformation driving apparatus for driving elements or products to be driven by a high or a low voltage, comprising:
   a pulse-width modulation (PWM) control unit for delivering output signals of a same phase and a same frequency;
   a plurality of driving units connecting to the PWM control unit and being driven synchronously by the signals of the same phase and the same frequency output by the PWM control unit;
   a plurality of transformation units connecting to the driving units and being driven by signals output by the driving units;
   a plurality of piezoelectric units connecting to the transformation units and being driven by signals output by the transformation units; and
   a plurality of loads connecting to the piezoelectric units and being driven by signals output by the piezoelectric units;
   wherein the PWM control unit drives a plurality of driving units then drives a single load through two paths of the driving units, the transformation units and the piezoelectric units.

7. The piezoelectric transformation driving apparatus of claim 6, wherein the two piezoelectric units output a pair of voltages of opposite phases to the load.

8. A piezoelectric transformation driving apparatus for driving elements or products to be driven by a high or a low voltage, comprising:
   a pulse-width modulation (PWM) control unit for delivering output signals of a same phase and a same frequency;
   a plurality of driving units connecting to the PWM control unit and being driven synchronously by the signals of the same phase and the same frequency output by the PWM control unit;
   a plurality of transformation units connecting to the driving units and being driven by signals output by the driving units;
   a plurality of piezoelectric units connecting to the transformation units and being driven by signals output by the transformation units; and
   a plurality of loads connecting to the piezoelectric units and being driven by signals output by the piezoelectric units;
   wherein the PWM control unit drives a plurality of driving units then drives two paths of the transformation units, the piezoelectric units and the load through a single driving unit.

* * * * *